(12) United States Patent
Yamaguchi et al.

(10) Patent No.: US 10,807,908 B2
(45) Date of Patent: Oct. 20, 2020

(54) OPTICAL COMPONENT

(71) Applicant: Sumitomo Electric Industries, Ltd., Osaka-shi (JP)

(72) Inventors: Ryota Yamaguchi, Osaka (JP); Soichiro Okubo, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 168 days.

(21) Appl. No.: 16/070,808

(22) PCT Filed: Jan. 12, 2017

(86) PCT No.: PCT/JP2017/000715
§ 371 (c)(1),
(2) Date: Jul. 18, 2018

(87) PCT Pub. No.: WO2017/126394
PCT Pub. Date: Jul. 27, 2017

(65) Prior Publication Data
US 2019/0023609 A1    Jan. 24, 2019

(30) Foreign Application Priority Data

Jan. 18, 2016 (JP) .................. 2016-007474
Jun. 3, 2016 (JP) .................. 2016-112206

(51) Int. Cl.
*G02B 1/14* (2015.01)
*C03C 17/34* (2006.01)
(Continued)

(52) U.S. Cl.
CPC ............ *C03C 17/3441* (2013.01); *C01G 9/08* (2013.01); *C03C 17/3482* (2013.01);
(Continued)

(58) Field of Classification Search
USPC ......... 428/408, 446; 359/350, 356, 359, 580
See application file for complete search history.

(56) References Cited

U.S. PATENT DOCUMENTS 5,818,631 A * 10/1998 Askinazi ................ G02B 1/105
  359/350
5,993,981 A * 11/1999 Askinazi ................ G02B 1/115
  359/580

(Continued)

FOREIGN PATENT DOCUMENTS

JP    64-009401 A    1/1989
JP    03-197676 A    8/1991
(Continued)

*Primary Examiner* — Archene A Turner
(74) *Attorney, Agent, or Firm* — Baker Botts L.L.P.; Michael A. Sartori (57) ABSTRACT

An optical component according to an embodiment of the present invention includes a translucent substrate, one or more intermediate layers stacked on at least one of an incident surface and an exit surface of the substrate, and a surface layer stacked on an outermost layer of the one or more intermediate layers, the surface layer containing diamond-like carbon as a main component. At least one intermediate layer among the one or more intermediate layers contains silicon as a main component, and the intermediate layer containing silicon as a main component has an oxygen content of 10 atomic % or less.

3 Claims, 1 Drawing Sheet (51) Int. Cl.
*C03C 17/36* (2006.01)
*G02B 1/113* (2015.01)
*C01G 9/08* (2006.01)
*C04B 35/547* (2006.01)
*C04B 35/645* (2006.01)
*C04B 41/00* (2006.01)
*C23C 16/26* (2006.01)
*C04B 41/52* (2006.01)
*C04B 41/89* (2006.01)
*C23C 14/18* (2006.01)
*C23C 16/505* (2006.01)
*C23C 14/30* (2006.01)
*C03C 3/32* (2006.01)
*C04B 111/80* (2006.01)

(52) U.S. Cl.
CPC ...... *C03C 17/3634* (2013.01); *C03C 17/3636* (2013.01); *C03C 17/3649* (2013.01); *C04B 35/547* (2013.01); *C04B 35/645* (2013.01); *C04B 41/009* (2013.01); *C04B 41/52* (2013.01); *C04B 41/89* (2013.01); *C23C 14/18* (2013.01); *C23C 14/30* (2013.01); *C23C 16/26* (2013.01); *C23C 16/505* (2013.01); *G02B 1/113* (2013.01); *G02B 1/14* (2015.01); *C01P 2006/60* (2013.01); *C03C 3/321* (2013.01); *C03C 2217/78* (2013.01); *C03C 2218/151* (2013.01); *C03C 2218/153* (2013.01); *C04B 2111/805* (2013.01); *C04B 2235/3284* (2013.01); *C04B 2235/5436* (2013.01); *C04B 2235/604* (2013.01); *C04B 2235/608* (2013.01); *C04B 2235/658* (2013.01); *C04B 2235/6567* (2013.01); *C04B 2235/661* (2013.01); *C04B 2235/72* (2013.01); *C04B 2235/9653* (2013.01)

(56) References Cited

U.S. PATENT DOCUMENTS 6,160,661 A * 12/2000 Klocek ................ C23C 16/301
359/359
2012/0038975 A1* 2/2012 Khajurivala ........... G02B 1/105
359/356

FOREIGN PATENT DOCUMENTS

| JP | 04-217201 A | 8/1992 |
| JP | 05-060901 A | 3/1993 |
| JP | 05-065625 A | 3/1993 |
| JP | 2010-170081 A | 8/2010 |
| JP | 2011-123185 A | 6/2011 |
| JP | 2015-224177 A | 12/2015 |

* cited by examiner

OPTICAL COMPONENT

TECHNICAL FIELD

The present invention relates to an optical component. The present application claims the priority based on Japanese Patent Application No. 2016-007474 filed on Jan. 18, 2016 and Japanese Patent Application No. 2016-112206 filed on Jun. 3, 2016, the entire contents of which are incorporated herein by reference.

BACKGROUND ART

Optical components, such as lenses, formed of a material that transmits infrared rays have been used for devices that use infrared rays, such as infrared sensors. With the increase in the performance of such devices, materials having a higher infrared transmittance have been demanded.

Examples of the material that transmits infrared rays include dielectrics such as zinc sulfide, zinc selenide, magnesium fluoride, sodium chloride, potassium chloride, lithium fluoride, silicon oxide, calcium fluoride, and barium fluoride; and semiconductors such as silicon and germanium. Among these materials, zinc sulfide has attracted attention as a material that transmits infrared rays because zinc sulfide transmits infrared rays in a relatively wide range of 0.4 µm or more and 14.4 µm or less and a relatively large polycrystalline bulk material can be obtained.

However, when zinc sulfide is used for components that possibly contact outer members such as objective lenses, the surfaces of the components are easily scratched because zinc sulfide has a relatively low hardness. Thus, there has been proposed an optical component that is not easily scratched by stacking a layer having a high hardness on a surface of a substrate formed of zinc sulfide (refer to Japanese Unexamined Patent Application Publication No. 2015-224177).

In the optical component described in PTL 1, formation of scratches is suppressed by forming a surface layer made of diamond-like carbon on an outermost surface (incident surface or exit surface) of a substrate mainly formed of a sintered body of zinc sulfide. In the optical component described in PTL 1, it is also disclosed that a plurality of intermediate layers are stacked between a base layer and the surface layer in order to suppress the decrease in infrared transmittance due to oxidation of zinc sulfide caused by ultraviolet rays and moisture in outdoor use, that is, to improve the weather resistance.

CITATION LIST

Patent Literature

PTL 1: Japanese Unexamined Patent Application Publication No. 2015-224177

However, if the optical component described in PTL 1 is used in a relatively severe high-temperature and high-humidity environment, the surface layer and the intermediate layers are mainly deteriorated because of formation of spots, which may decrease the infrared transmittance.

SUMMARY OF INVENTION

Solution to Problem

An optical component according to an aspect of the present invention includes a translucent substrate; one or more intermediate layers stacked on at least one of an incident surface and an exit surface of the substrate; and a surface layer stacked on an outermost layer of the one or more intermediate layers, the surface layer containing diamond-like carbon as a main component, wherein at least one intermediate layer among the one or more intermediate layers contains silicon as a main component, and the intermediate layer containing silicon as a main component has an oxygen content of 10 atomic % or less.

DESCRIPTION OF EMBODIMENTS

Problem to be Solved by the Disclosure

In view of the foregoing, it is an object of the present invention to provide an optical component having a relatively high weather resistance.

Advantageous Effects of Invention

The optical component according to an aspect of the present invention has a relatively high weather resistance.

Description of Embodiments of the Present Invention

An optical component according to an aspect of the present invention includes a translucent substrate; one or more intermediate layers stacked on at least one of an incident surface and an exit surface of the substrate; and a surface layer stacked on an outermost layer of the one or more intermediate layers, the surface layer containing diamond-like carbon as a main component, wherein at least one intermediate layer among the one or more intermediate layers contains silicon as a main component, and the intermediate layer containing silicon as a main component has an oxygen content of 10 atomic % or less.

In the optical component, when at least one of the intermediate layers contains silicon as a main component and the oxygen content of the intermediate layer containing silicon as a main component is less than or equal to the upper limit, infrared vibration absorption due to oxidation of silicon does not frequently occur even if the optical component is used in a high-temperature and high-humidity environment. That is, the optical component has a relatively high weather resistance.

The optical component includes a plurality of the intermediate layers, and at least one intermediate layer among the plurality of intermediate layers may contain diamond-like carbon as a main component. In the case where the optical component includes a plurality of the intermediate layers and at least one intermediate layer among the plurality of intermediate layers contains diamond-like carbon as a main component, even if the surface layer is damaged or detached, the intermediate layer containing diamond-like carbon as a main component can protect the substrate. This can effectively suppress a decrease in the infrared transmittance even when the optical component is used in a severe environment or for a long time.

The substrate may contain a sintered body of zinc sulfide as a main component. In the optical component, when the substrate contains a sintered body of zinc sulfide as a main component, a relatively high infrared transmittance is achieved and the production is relatively easily performed.

Herein, the term "translucent" means that the infrared transmittance is 60% or more and preferably 70% or more. The term "infrared transmittance" refers to an average transmittance of infrared light having a wavelength of 8 μm or more and 12 μm or less, which is a value measured by a method conforming to JIS-B7107 (1997). The term "main component" refers to a component having the highest mass content and preferably refers to a component having a content of 95 mass % or more. The "oxygen content" is a value obtained by removing a surface layer region having a depth of 50 nm from the surface of a layer by sputtering and performing measurement by electron spectroscopy for chemical analysis (ESCA) in conformity with JIS-K0146 (2002).

Details of Embodiments of the Present Invention

Hereafter, embodiments of the optical component according to the present invention will be described in detail with reference to the attached drawing.

Figure 1:
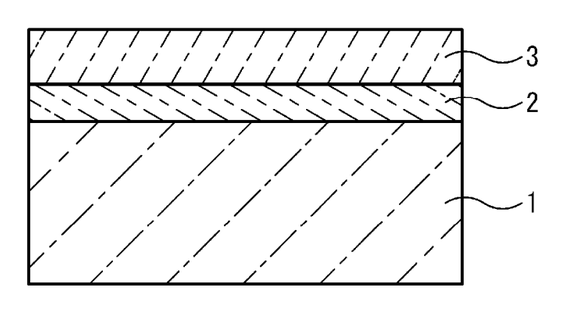
FIG. 1 is a schematic sectional view illustrating a structure of an optical component according to an embodiment of the present invention.

The optical component according to an aspect of the present invention in FIG. 1 is a member provided in order to transmit light such as infrared light. The optical component is used as, for example, a lens or a window member (a cover for a light inlet or light outlet) for optical devices.

The optical component includes a translucent substrate 1, one or more intermediate layers 2 (FIG. 1 illustrates the case of a single layer) stacked on an incident surface or an exit surface (generally, an exit surface in a light projector of a device including the optical component or an incident surface in a light receiver of the device) of the substrate, and a surface layer 3 that is stacked on an outermost layer of the intermediate layers 2 and contains diamond-like carbon as a main component.

In the optical component, at least one of the intermediate layers 2 contains silicon (Si), which is excellent in terms of adhesiveness, as a main component.

The lower limit of the oxygen content of the intermediate layer 2 containing silicon as a main component is preferably 1.0 atomic % and more preferably 1.5 atomic %. The upper limit of the oxygen content of the intermediate layer 2 containing silicon as a main component is 10 atomic %, preferably 6 atomic %, and more preferably 4 atomic %. If the oxygen content of the intermediate layer 2 containing silicon as a main component falls below the lower limit, the production is not easily performed, which may unnecessarily increase the cost. If the oxygen content of the intermediate layer 2 containing silicon as a main component exceeds the upper limit, the occurrence of infrared vibration absorption due to oxidation of silicon in a high-temperature and high-humidity environment cannot be sufficiently suppressed, which may decrease the infrared transmittance.

The oxygen content of the intermediate layer 2 containing silicon as a main component is believed to affect the weather resistance of the optical component because oxygen bonds to silicon in the intermediate layer 2 containing silicon as a main component. More specifically, silicon to which oxygen bonds is a defect in a silicon crystal and therefore deteriorates the barrier properties of the intermediate layer 2 against water molecules. It is also believed that silicon atoms to which oxygen bonds bond to each other through the oxygen atom to form a siloxane bond (—S—O—S—), thereby coarsening the defect in the silicon crystal and further deteriorating the barrier properties. Therefore, it is believed that, by setting the oxygen content of the intermediate layer 2 containing silicon as a main component to a content less than or equal to the upper limit, the weather resistance of the optical component can be improved.

<Substrate>

The substrate 1 is a member that substantially defines the optical function of the optical component and is also a mechanical structure. Therefore, the shape of the substrate 1 is freely selected in accordance with the requirements of, for example, optical function, mechanical strength, and attachment structure to optical devices.

It is sufficient that the substrate 1 contains, as a main component, a translucent material such as a material that transmits infrared rays. Examples of the material include dielectrics such as zinc sulfide (ZnS), zinc selenide (ZnSe), magnesium fluoride (MgF$_2$), sodium chloride (NaCl), potassium chloride (KCl), lithium fluoride (LiF), silicon oxide (SiO$_2$), calcium fluoride (CaF$_2$), and barium fluoride (BaF$_2$); semiconductors such as silicon and germanium; and Ge—As—Se, As—Se, Ge—Sb—Se, Tl—Ge—Se, Sb—Ge—Sn—S, As—Te—Ge—Si, and Cu—Sb—S chalcogenide glasses. In particular, the main component of the substrate 1 is preferably zinc sulfide or chalcogenide glass, which has a relatively high infrared transmittance.

When the substrate 1 contains zinc sulfide as a main component, the substrate 1 may be formed by chemical vapor deposition (CVD). However, the production cost can be reduced by forming the substrate 1 through sintering of a relatively inexpensive zinc sulfide powder. That is, the substrate 1 is preferably a sintered body of a material containing zinc sulfide as a main component. In other words, the main component of the substrate 1 is preferably a sintered body of zinc sulfide.

The substrate 1 containing a sintered body of zinc sulfide as a main component can be formed by a method that includes a step of molding a zinc sulfide powder, a step of performing pre-sintering on the molded body, and a step of performing pressure sintering on the pre-sintered body.

The zinc sulfide powder for forming a sintered body of zinc sulfide preferably has an average particle size of 1 μm or more and 3 μm or less and a purity of 95 mass % or more. Such a zinc sulfide powder can be obtained by a publicly known powder synthesis method such as a coprecipitation method. The term "average particle size" refers to a particle size at which the volume integrated value reaches 50% in a particle size distribution measured by a laser diffraction method.

In the above molding step, a molded body is formed by performing press molding with a mold so as to have a rough shape of an optical component to be obtained in the end. The mold is formed of a hard material such as a cemented carbide or a tool steel. The molding step can be performed by using, for example, a uniaxial press.

In the pre-sintering step, the molded body obtained in the molding step is heated in, for example, a vacuum atmosphere at 30 Pa or less or an inert atmosphere of nitrogen gas or the like at an atmospheric pressure. The pre-sintering temperature can be set to 500° C. or higher and 1000° C. or lower. The pre-sintering time (the holding time at the pre-sintering temperature) can be set to 0.5 hours or more and 15 hours or less. The pre-sintered body obtained in the pre-sintering step has a relative density of 55% or more and 80% or less.

In the pressure sintering step, the pre-sintered body is heated under pressure using a press die to obtain a sintered body (substrate 1) having a desired shape. Specifically, a pair of dies (upper die and lower die) formed of, for example, glassy carbon and having a constraint face (cavity) subjected to mirror polishing can be used as the press die. The pressure sintering temperature is preferably 550° C. or higher and 1200° C. or lower. The sintering pressure is preferably 10 MPa or more and 300 MPa or less. The sintering time is preferably 1 minute or more and 60 minutes or less.

The sintered body obtained in the pressure sintering step may be directly used as the substrate 1. Alternatively, the sintered body may be used as the substrate 1 after finish machining such as polishing of an incident surface or an exit surface is optionally performed.

<Intermediate Layer>

The intermediate layer 2 is a functional layer formed between the substrate 1 and a surface layer 3 described later in order to, for example, improve the adhesiveness of the surface layer 3, prevent the reflection of light in an operating wavelength band, and protect the substrate 1. The intermediate layer 2 has translucency so as not to inhibit the incidence and emission of infrared light through the substrate 1.

Examples of the main component of the intermediate layer 2 include silicon (Si), germanium (Ge), gallium phosphide (GaP), boron phosphide (BP), yttrium oxide ($Y_2O_3$), aluminum oxide ($Al_2O_3$), titanium oxide ($TiO_2$), yttrium fluoride ($YF_3$), lanthanum fluoride ($LaF_3$), cerium fluoride ($CeF_3$), magnesium fluoride ($MgF_2$), zinc selenide (ZnSe), and diamond-like carbon.

As described above, the optical component includes at least one intermediate layer 2 that contains silicon as a main component and has an oxygen content within the above range. The intermediate layer 2 containing silicon as a main component does not readily undergo infrared vibration absorption due to oxidation of silicon, which improves the weather resistance of the optical component.

The intermediate layer 2 containing silicon as a main component has a relatively high adhesiveness. Therefore, when the intermediate layer 2 containing silicon as a main component is stacked so as to be adjacent to a surface layer 3 that contains diamond-like carbon as a main component and tends to have a low adhesiveness, the reliability of the optical component can be improved.

The lower limit of the average thickness of each intermediate layer 2 is preferably 5 nm and more preferably 50 nm. The upper limit of the average thickness of each intermediate layer 2 is preferably 200 nm and more preferably 5 nm. If the average thickness of each intermediate layer 2 falls below the lower limit, the manufacturing error may increase. If the average thickness of each intermediate layer 2 exceeds the upper limit, the infrared transmittance of the optical component may unnecessarily decrease.

The optical component preferably includes a plurality of intermediate layers 2. In this case, at least one intermediate layer 2 among the plurality of intermediate layers 2 preferably contains diamond-like carbon as a main component. Even if the surface layer 3 is damaged, the intermediate layer 2 containing diamond-like carbon as a main component can protect the substrate 1 instead of the surface layer 3. The intermediate layer 2 containing diamond-like carbon as a main component is preferably stacked above another layer such that the intermediate layer 2 containing silicon or germanium as a main component and having a high adhesiveness is interposed therebetween.

The diamond-like carbon that can be used as a main component of the intermediate layer 2 is amorphous carbon containing both sp3 bonds, which constitute a diamond structure, and sp2 bonds, which constitute a graphite structure.

The intermediate layer 2 made of a material other than diamond-like carbon can be formed by a publicly known method such as a sputtering method, a vacuum deposition method, an ion plating method, a CVD method, or a plasma CVD method. The intermediate layer 2 made of diamond-like carbon can be formed by a publicly known method such as a plasma CVD method, a thermal filament method, an ion plating method, a sputtering method, or an ion beam method.

For example, when the intermediate layer 2 is stacked by a vacuum deposition method, the oxygen content of the intermediate layer 2 containing silicon as a main component can be adjusted by controlling the degree of vacuum, the deposition rate, the raw material purity, and the like.

<Surface Layer>

The surface layer 3 is a protective layer for improving the scratch resistance of the optical component, that is, for preventing damage to the substrate 1. The surface layer 3 has translucency so as not to inhibit the incidence and emission of infrared light through the substrate 1.

The diamond-like carbon that is a main component of the surface layer 3 is amorphous carbon containing both sp3 bonds, which constitute a diamond structure, and sp2 bonds, which constitute a graphite structure.

Diamond-like carbon is a material that exhibits various physical properties in accordance with, for example, the ratio of sp3 bonds and sp2 bonds contained in the diamond-like carbon, the ratio of hydrogen atoms in the structure, and the presence or absence of other elements in the structure. In general, the physical properties of diamond-like carbon come close to those of diamond as the ratio of sp3 bonds increases and come close to those of graphite as the ratio of sp2 bonds increases. Furthermore, when the ratio of hydrogen atoms contained is increased, diamond-like carbon exhibits physical properties similar to those of polymers.

Such diamond-like carbon can be generally classified into ta-C (tetrahedral amorphous carbon), a-C (amorphous carbon), ta-C:H (hydrogenated tetrahedral amorphous carbon), and a-C:H (hydrogenated amorphous carbon) on the basis of the sp3 bond, the sp2 bond, and the hydrogen content. The diamond-like carbon that is a main component of the surface layer 3 may be the same as or different from the diamond-like carbon that is a main component of the intermediate layer 2.

The lower limit of the average thickness of the surface layer 3 is preferably 20 nm and more preferably 100 nm. The upper limit of the average thickness of the surface layer 3 is preferably 200 μm and more preferably 10 μm. If the average thickness of the surface layer 3 falls below the lower limit, the surface layer 3 may have insufficient strength. If the average thickness of the surface layer 3 exceeds the upper limit, the infrared transmittance of the optical component may unnecessarily decrease.

The surface layer 3 can be formed by a publicly known method such as a sputtering method, a vacuum deposition method, an ion plating method, a CVD method, or a plasma CVD method.

Other Embodiments

It should be understood that the embodiments disclosed herein are illustrative and non-restrictive in all aspects. The scope of the present invention is not limited to the embodiments described above but is defined by the claims, and is intended to include all modifications within the meaning and scope equivalent to those of the claims.

In the optical component, the intermediate layers and the surface layer may be stacked on both the incident surface and the exit surface. The optical component may further include layers other than the above-described layers, such as a light diffusing layer, a reflecting layer, a filter layer, and a polarizing layer.

EXAMPLES

Hereafter, the present invention will be described in detail based on Examples. However, the present invention is not interpreted as being restrictive based on the description of Examples.

Optical components in Production Examples 1 to 48 will be described. The optical components in Production Examples 1 to 48 each include a substrate made of a material listed in Table 1 or 2 and having a design thickness listed in Table 1 or 2, a plurality of intermediate layers, and a surface layer.

TABLE 1

|  | Substrate | First intermediate layer | Second intermediate layer | Third intermediate layer | Fourth intermediate layer | Surface layer |
|---|---|---|---|---|---|---|
| Production Example 1 | ZnS | Si | DLC | Si | Ge | DLC |
| Production Example 2 | (3 mm) | (289 nm) | (150 nm) | (70 nm) | (837 nm) | (1100 nm) |
| Production Example 3 | | | | | | |
| Production Example 4 | | | | | | |
| Production Example 5 | ZnS | Si | DLC | Ge | Si | DLC |
| Production Example 6 | (3 mm) | (200 nm) | (258 nm) | (866 nm) | (200 nm) | (978 nm) |
| Production Example 7 | | | | | | |
| Production Example 8 | | | | | | |
| Production Example 9 | ZnS | Si | Ge | DLC | Si | DLC |
| Production Example 10 | (3 mm) | (103 nm) | (70 nm) | (150 nm) | (70 nm) | (1324 nm) |
| Production Example 11 | | | | | | |
| Production Example 12 | | | | | | |
| Production Example 13 | ZnS | Si | DLC | Si | None | DLC |
| Production Example 14 | (3 mm) | (267 nm) | (225 nm) | (863 nm) | | (1125 nm) |
| Production Example 15 | | | | | | |
| Production Example 16 | | | | | | |
| Production Example 17 | ZnS | Si | Ge | Si | None | DLC |
| Production Example 18 | (3 mm) | (644 nm) | (535 nm) | (94 nm) | | (1100 nm) |
| Production Example 19 | | | | | | |
| Production Example 20 | | | | | | |
| Production Example 21 | ZnS | Si | None | None | None | DLC |
| Production Example 22 | (3 mm) | (244 nm) | | | | (1440 nm) |
| Production Example 23 | | | | | | |
| Production Example 24 | | | | | | |

TABLE 2

|  | Substrate | First intermediate layer | Second intermediate layer | Third intermediate layer | Fourth intermediate layer | Surface layer |
|---|---|---|---|---|---|---|
| Production Example 25 | Chalcogenide glass | Si | DLC | Si | Ge | DLC |
| Production Example 26 | (3 mm) | (241 nm) | (150 nm) | (70 nm) | (955 nm) | (1087 nm) |
| Production Example 27 | | | | | | |
| Production Example 28 | | | | | | |
| Production Example 29 | Chalcogenide glass | Si | DLC | Ge | Si | DLC |
| Production Example 30 | (3 mm) | (295 nm) | (150 nm) | (779 nm) | (217 nm) | (1014 nm) |
| Production Example 31 | | | | | | |
| Production Example 32 | | | | | | |
| Production Example 33 | Chalcogenide glass | Si | Ge | DLC | Si | DLC |
| Production Example 34 | (3 mm) | (125 nm) | (70 nm) | (150 nm) | (70 nm) | (1237 nm) |
| Production Example 35 | | | | | | |
| Production Example 36 | | | | | | |
| Production Example 37 | Chalcogenide glass | Si | Ge | Si | None | DLC |
| Production Example 38 | (3 mm) | (595 nm) | (552 nm) | (168 nm) | | (1065 nm) |
| Production Example 39 | | | | | | |
| Production Example 40 | | | | | | |
| Production Example 41 | Chalcogenide glass | Si | DLC | Si | None | DLC |
| Production Example 42 | (3 mm) | (291 nm) | (137 nm) | (874 nm) | | (1109 nm) |
| Production Example 43 | | | | | | |
| Production Example 44 | | | | | | |
| Production Example 45 | Chalcogenide glass | Si | None | None | None | DLC |
| Production Example 46 | (3 mm) | (279 nm) | | | | (1345 nm) |
| Production Example 47 | | | | | | |
| Production Example 48 | | | | | | |

Production Example 1

An optical component in Production Example 1 includes a disc-shaped substrate formed of a sintered body of zinc sulfide, first to fourth intermediate layers sequentially stacked on the surface of the substrate, and a surface layer further stacked on the surface of the fourth intermediate layer.

(Substrate)

The substrate was produced through the following procedure. First, a zinc sulfide powder having an average particle size of 2 μm and a purity of 98 mass % was molded by uniaxial pressing (cold pressing) to produce a disc-shaped molded body having a diameter of 20 mm and an average thickness of 5 mm. Then, the obtained molded body was heated to 800° C. in a nitrogen atmosphere and held for 5 hours to obtain a pre-sintered body having a relative density of about 60%. The pre-sintered body was placed between a pair of dies (upper die and lower die) formed of glassy carbon and having a constraint face subjected to mirror polishing, heated to 1000° C. while a pressure of 50 MPa was applied, and held for 300 seconds. Thus, a substrate having a diameter of 20 mm and an average thickness of 3 mm was produced.

(First Intermediate Layer)

The first intermediate layer was formed by depositing silicon by a vacuum deposition method using electron beams at a degree of vacuum of $5 \times 10^{-4}$ Pa under conditions in which an average thickness of 289 nm was to be achieved.

(Second Intermediate Layer)

The second intermediate layer was formed by depositing diamond-like carbon (given as DLC in Tables) by an RF plasma CVD method at 13.56 MHz using methane gas as a raw material under conditions in which an average thickness of 150 nm was to be achieved.

(Third Intermediate Layer)

The third intermediate layer was formed by depositing silicon by a vacuum deposition method using electron beams under conditions in which an average thickness of 70 nm was to be achieved.

(Fourth Intermediate Layer)

The fourth intermediate layer was formed by depositing germanium by a vacuum deposition method using electron beams under conditions in which an average thickness of 837 nm was to be achieved.

(Surface Layer)

The surface layer was formed by depositing diamond-like carbon by an RF plasma CVD method at 13.56 MHz using methane gas as a raw material under conditions in which an average thickness of 1100 nm was to be achieved.

Production Example 2

An optical component in Production Example 2 was experimentally produced under the same conditions as in Production Example 1, except that the degree of vacuum during the stacking of the first intermediate layer and the third intermediate layer was set to $2 \times 10^{-4}$ Pa.

Production Example 3

An optical component in Production Example 3 was experimentally produced under the same conditions as in Production Example 1, except that the degree of vacuum during the stacking of the first intermediate layer and the third intermediate layer was set to $1 \times 10^{-4}$ Pa.

Production Example 4

An optical component in Production Example 4 was experimentally produced under the same conditions as in Production Example 1, except that the degree of vacuum during the stacking of the first intermediate layer and the third intermediate layer was set to $1 \times 10^{-3}$ Pa.

Production Example 5

An optical component in Production Example 5 includes the same substrate as in Production Example 1, first to fourth intermediate layers sequentially stacked on the surface of the substrate, and a surface layer stacked on the surface of the fourth intermediate layer.

(First Intermediate Layer)

The first intermediate layer was formed by depositing silicon by a vacuum deposition method using electron beams at a degree of vacuum of $5 \times 10^{-4}$ Pa under conditions in which an average thickness of 200 nm was to be achieved.

(Second Intermediate Layer)

The second intermediate layer was formed by depositing diamond-like carbon by an RF plasma CVD method at 13.56 MHz using methane gas as a raw material under conditions in which an average thickness of 258 nm was to be achieved.

(Third Intermediate Layer)

The third intermediate layer was formed by depositing germanium by a vacuum deposition method using electron beams under conditions in which an average thickness of 866 nm was to be achieved.

(Fourth Intermediate Layer)

The fourth intermediate layer was formed by depositing silicon by a vacuum deposition method using electron beams under conditions in which an average thickness of 200 nm was to be achieved.

(Surface Layer)

The surface layer was formed by depositing diamond-like carbon by an RF plasma CVD method at 13.56 MHz using methane gas as a raw material under conditions in which an average thickness of 978 nm was to be achieved.

Production Example 6

An optical component in Production Example 6 was experimentally produced under the same conditions as in Production Example 5, except that the degree of vacuum during the stacking of the first intermediate layer and the fourth intermediate layer was set to $2 \times 10^{-4}$ Pa.

Production Example 7

An optical component in Production Example 7 was experimentally produced under the same conditions as in Production Example 5, except that the degree of vacuum during the stacking of the first intermediate layer and the fourth intermediate layer was set to $1 \times 10^{-4}$ Pa.

Production Example 8

An optical component in Production Example 8 was experimentally produced under the same conditions as in Production Example 5, except that the degree of vacuum during the stacking of the first intermediate layer and the fourth intermediate layer was set to $1 \times 10^{-3}$ Pa.

Production Example 9

An optical component in Production Example 9 includes the same substrate as in Production Example 1, first to fourth intermediate layers sequentially stacked on the surface of the substrate, and a surface layer stacked on the surface of the fourth intermediate layer.
(First Intermediate Layer)

The first intermediate layer was formed by depositing silicon by a vacuum deposition method using electron beams at a degree of vacuum of $5\times10^{-4}$ Pa under conditions in which an average thickness of 103 nm was to be achieved.
(Second Intermediate Layer)

The second intermediate layer was formed by depositing germanium by a vacuum deposition method using electron beams under conditions in which an average thickness of 70 nm was to be achieved.
(Third Intermediate Layer)

The third intermediate layer was formed by depositing diamond-like carbon by an RF plasma CVD method at 13.56 MHz using methane gas as a raw material under conditions in which an average thickness of 150 nm was to be achieved.
(Fourth Intermediate Layer)

The fourth intermediate layer was formed by depositing silicon by a vacuum deposition method using electron beams under conditions in which an average thickness of 70 nm was to be achieved.
(Surface Layer)

The surface layer was formed by depositing diamond-like carbon by an RF plasma CVD method at 13.56 MHz using methane gas as a raw material under conditions in which an average thickness of 1324 nm was to be achieved.

Production Example 10

An optical component in Production Example 10 was experimentally produced under the same conditions as in Production Example 9, except that the degree of vacuum during the stacking of the first intermediate layer and the fourth intermediate layer was set to $2\times10^{-4}$ Pa.

Production Example 11

An optical component in Production Example 11 was experimentally produced under the same conditions as in Production Example 9, except that the degree of vacuum during the stacking of the first intermediate layer and the fourth intermediate layer was set to $1\times10^{-4}$ Pa.

Production Example 12

An optical component in Production Example 12 was experimentally produced under the same conditions as in Production Example 9, except that the degree of vacuum during the stacking of the first intermediate layer and the fourth intermediate layer was set to $1\times10^{-3}$ Pa.

Production Example 13

An optical component in Production Example 13 includes the same substrate as in Production Example 1, first to third intermediate layers sequentially stacked on the surface of the substrate, and a surface layer stacked on the surface of the third intermediate layer.
(First Intermediate Layer)

The first intermediate layer was formed by depositing silicon by a vacuum deposition method using electron beams at a degree of vacuum of $5\times10^{-4}$ Pa under conditions in which an average thickness of 267 nm was to be achieved.
(Second Intermediate Layer)

The second intermediate layer was formed by depositing diamond-like carbon by an RF plasma CVD method at 13.56 MHz using methane gas as a raw material under conditions in which an average thickness of 225 nm was to be achieved.
(Third Intermediate Layer)

The third intermediate layer was formed by depositing silicon by a vacuum deposition method using electron beams under conditions in which an average thickness of 863 nm was to be achieved.
(Surface Layer)

The surface layer was formed by depositing diamond-like carbon by an RF plasma CVD method at 13.56 MHz using methane gas as a raw material under conditions in which an average thickness of 1125 nm was to be achieved.

Production Example 14

An optical component in Production Example 14 was experimentally produced under the same conditions as in Production Example 13, except that the degree of vacuum during the stacking of the first intermediate layer and the third intermediate layer was set to $2\times10^{-4}$ Pa.

Production Example 15

An optical component in Production Example 15 was experimentally produced under the same conditions as in Production Example 13, except that the degree of vacuum during the stacking of the first intermediate layer and the third intermediate layer was set to $1\times10^{-4}$ Pa.

Production Example 16

An optical component in Production Example 16 was experimentally produced under the same conditions as in Production Example 13, except that the degree of vacuum during the stacking of the first intermediate layer and the third intermediate layer was set to $1\times10^{-3}$ Pa.

Production Example 17

An optical component in Production Example 17 includes the same substrate as in Production Example 1, first to third intermediate layers sequentially stacked on the surface of the substrate, and a surface layer stacked on the surface of the third intermediate layer.
(First Intermediate Layer)

The first intermediate layer was formed by depositing silicon by a vacuum deposition method using electron beams at a degree of vacuum of $5\times10^{-4}$ Pa under conditions in which an average thickness of 644 nm was to be achieved.
(Second Intermediate Layer)

The second intermediate layer was formed by depositing germanium by a vacuum deposition method using electron beams under conditions in which an average thickness of 535 nm was to be achieved.
(Third Intermediate Layer)

The third intermediate layer was formed by depositing silicon by a vacuum deposition method using electron beams under conditions in which an average thickness of 94 nm was to be achieved.
(Surface Layer)

The surface layer was formed by depositing diamond-like carbon by an RF plasma CVD method at 13.56 MHz using methane gas as a raw material under conditions in which an average thickness of 1100 nm was to be achieved.

Production Example 18

An optical component in Production Example 18 was experimentally produced under the same conditions as in Production Example 17, except that the degree of vacuum during the stacking of the first intermediate layer and the third intermediate layer was set to $2\times10^{-4}$ Pa.

Production Example 19

An optical component in Production Example 19 was experimentally produced under the same conditions as in Production Example 17, except that the degree of vacuum during the stacking of the first intermediate layer and the third intermediate layer was set to $1\times10^{-4}$ Pa.

Production Example 20

An optical component in Production Example 20 was experimentally produced under the same conditions as in Production Example 17, except that the degree of vacuum during the stacking of the first intermediate layer and the third intermediate layer was set to $1\times10^{-3}$ Pa.

Production Example 21

An optical component in Production Example 21 includes the same substrate as in Production Example 1, a first intermediate layer stacked on the surface of the substrate, and a surface layer stacked on the surface of the first intermediate layer.
(First Intermediate Layer)
The first intermediate layer was formed by depositing silicon by a vacuum deposition method using electron beams at a degree of vacuum of $5\times10^{-4}$ Pa under conditions in which an average thickness of 244 nm was to be achieved.
(Surface Layer)
The surface layer was formed by depositing diamond-like carbon by an RF plasma CVD method at 13.56 MHz using methane gas as a raw material under conditions in which an average thickness of 1440 nm was to be achieved.

Production Example 22

An optical component in Production Example 22 was experimentally produced under the same conditions as in Production Example 21, except that the degree of vacuum during the stacking of the first intermediate layer was set to $2\times10^{-4}$ Pa.

Production Example 23

An optical component in Production Example 23 was experimentally produced under the same conditions as in Production Example 21, except that the degree of vacuum during the stacking of the first intermediate layer was set to $1\times10^{-4}$ Pa.

Production Example 24

An optical component in Production Example 24 was experimentally produced under the same conditions as in Production Example 21, except that the degree of vacuum during the stacking of the first intermediate layer was set to $1\times10^{-3}$ Pa.

Production Example 25

An optical component in Production Example 25 includes a disc-shaped substrate (diameter: 20 mm, average thickness: 3 mm) made of a Ge—As—Se chalcogenide glass, first to fourth intermediate layers sequentially stacked on the surface of the substrate, and a surface layer further stacked on the surface of the fourth intermediate layer.
(First Intermediate Layer)
The first intermediate layer was formed by depositing silicon by a vacuum deposition method using electron beams at a degree of vacuum of $5\times10^{-4}$ Pa under conditions in which an average thickness of 241 nm was to be achieved.
(Second Intermediate Layer)
The second intermediate layer was formed by depositing diamond-like carbon (given as DLC in Tables) by an RF plasma CVD method at 13.56 MHz using methane gas as a raw material under conditions in which an average thickness of 150 nm was to be achieved.
(Third Intermediate Layer)
The third intermediate layer was formed by depositing silicon by a vacuum deposition method using electron beams under conditions in which an average thickness of 70 nm was to be achieved.
(Fourth Intermediate Layer)
The fourth intermediate layer was formed by depositing germanium by a vacuum deposition method using electron beams under conditions in which an average thickness of 955 nm was to be achieved.
(Surface Layer)
The surface layer was formed by depositing diamond-like carbon by an RF plasma CVD method at 13.56 MHz using methane gas as a raw material under conditions in which an average thickness of 1087 nm was to be achieved.

Production Example 26

An optical component in Production Example 26 was experimentally produced under the same conditions as in Production Example 25, except that the degree of vacuum during the stacking of the first intermediate layer and the third intermediate layer was set to $2\times10^{-4}$ Pa.

Production Example 27

An optical component in Production Example 27 was experimentally produced under the same conditions as in Production Example 25, except that the degree of vacuum during the stacking of the first intermediate layer and the third intermediate layer was set to $1\times10^{-4}$ Pa.

Production Example 28

An optical component in Production Example 28 was experimentally produced under the same conditions as in Production Example 25, except that the degree of vacuum during the stacking of the first intermediate layer and the third intermediate layer was set to $1\times10^{-3}$ Pa.

Production Example 29

An optical component in Production Example 29 includes the same substrate as in Production Example 25, first to fourth intermediate layers sequentially stacked on the surface of the substrate, and a surface layer stacked on the surface of the fourth intermediate layer.
(First Intermediate Layer)
The first intermediate layer was formed by depositing silicon by a vacuum deposition method using electron beams at a degree of vacuum of $5\times10^{-4}$ Pa under conditions in which an average thickness of 295 nm was to be achieved.

(Second Intermediate Layer)

The second intermediate layer was formed by depositing diamond-like carbon by an RF plasma CVD method at 13.56 MHz using methane gas as a raw material under conditions in which an average thickness of 150 nm was to be achieved.
(Third Intermediate Layer)

The third intermediate layer was formed by depositing germanium by a vacuum deposition method using electron beams under conditions in which an average thickness of 779 nm was to be achieved.
(Fourth Intermediate Layer)

The fourth intermediate layer was formed by depositing silicon by a vacuum deposition method using electron beams under conditions in which an average thickness of 217 nm was to be achieved.
(Surface Layer)

The surface layer was formed by depositing diamond-like carbon by an RF plasma CVD method at 13.56 MHz using methane gas as a raw material under conditions in which an average thickness of 1014 nm was to be achieved.

Production Example 30

An optical component in Production Example 30 was experimentally produced under the same conditions as in Production Example 29, except that the degree of vacuum during the stacking of the first intermediate layer and the fourth intermediate layer was set to $2\times10^{-4}$ Pa.

Production Example 31

An optical component in Production Example 31 was experimentally produced under the same conditions as in Production Example 29, except that the degree of vacuum during the stacking of the first intermediate layer and the fourth intermediate layer was set to $1\times10^{-4}$ Pa.

Production Example 32

An optical component in Production Example 32 was experimentally produced under the same conditions as in Production Example 29, except that the degree of vacuum during the stacking of the first intermediate layer and the fourth intermediate layer was set to $1\times10^{-3}$ Pa.

Production Example 33

An optical component in Production Example 33 includes a disc-shaped substrate (diameter: 20 mm, average thickness: 3 mm) made of a Ge—As chalcogenide glass, first to fourth intermediate layers sequentially stacked on the surface of the substrate, and a surface layer stacked on the surface of the fourth intermediate layer.
(First Intermediate Layer)

The first intermediate layer was formed by depositing silicon by a vacuum deposition method using electron beams at a degree of vacuum of $5\times10^{-4}$ Pa under conditions in which an average thickness of 125 nm was to be achieved.
(Second Intermediate Layer)

The second intermediate layer was formed by depositing germanium by a vacuum deposition method using electron beams under conditions in which an average thickness of 70 nm was to be achieved.
(Third Intermediate Layer)

The third intermediate layer was formed by depositing diamond-like carbon by an RF plasma CVD method at 13.56 MHz using methane gas as a raw material under conditions in which an average thickness of 150 nm was to be achieved.
(Fourth Intermediate Layer)

The fourth intermediate layer was formed by depositing silicon by a vacuum deposition method using electron beams under conditions in which an average thickness of 70 nm was to be achieved.
(Surface Layer)

The surface layer was formed by depositing diamond-like carbon by an RF plasma CVD method at 13.56 MHz using methane gas as a raw material under conditions in which an average thickness of 1237 nm was to be achieved.

Production Example 34

An optical component in Production Example 34 was experimentally produced under the same conditions as in Production Example 33, except that the degree of vacuum during the stacking of the first intermediate layer and the fourth intermediate layer was set to $2\times10^{-4}$ Pa.

Production Example 35

An optical component in Production Example 35 was experimentally produced under the same conditions as in Production Example 33, except that the degree of vacuum during the stacking of the first intermediate layer and the fourth intermediate layer was set to $1\times10^{-4}$ Pa.

Production Example 36

An optical component in Production Example 36 was experimentally produced under the same conditions as in Production Example 33, except that the degree of vacuum during the stacking of the first intermediate layer and the fourth intermediate layer was set to $1\times10^{-3}$ Pa.

Production Example 37

An optical component in Production Example 37 includes the same substrate as in Production Example 33, first to third intermediate layers sequentially stacked on the surface of the substrate, and a surface layer stacked on the surface of the third intermediate layer.
(First Intermediate Layer)

The first intermediate layer was formed by depositing silicon by a vacuum deposition method using electron beams at a degree of vacuum of $5\times10^{-4}$ Pa under conditions in which an average thickness of 595 nm was to be achieved.
(Second Intermediate Layer)

The second intermediate layer was formed by depositing germanium by a vacuum deposition method using electron beams under conditions in which an average thickness of 552 nm was to be achieved.
(Third Intermediate Layer)

The third intermediate layer was formed by depositing silicon by a vacuum deposition method using electron beams under conditions in which an average thickness of 168 nm was to be achieved.
(Surface Layer)

The surface layer was formed by depositing diamond-like carbon by an RF plasma CVD method at 13.56 MHz using methane gas as a raw material under conditions in which an average thickness of 1065 nm was to be achieved.

Production Example 38

An optical component in Production Example 38 was experimentally produced under the same conditions as in Production Example 37, except that the degree of vacuum during the stacking of the first intermediate layer and the third intermediate layer was set to $2\times10^{-4}$ Pa.

Production Example 39

An optical component in Production Example 39 was experimentally produced under the same conditions as in Production Example 37, except that the degree of vacuum during the stacking of the first intermediate layer and the third intermediate layer was set to $1\times10^{-4}$ Pa.

Production Example 40

An optical component in Production Example 40 was experimentally produced under the same conditions as in Production Example 37, except that the degree of vacuum during the stacking of the first intermediate layer and the third intermediate layer was set to $1\times10^{-3}$ Pa.

Production Example 41

An optical component in Production Example 41 includes a disc-shaped substrate (diameter: 20 mm, average thickness: 3 mm) made of a Ge—Sb—Se chalcogenide glass, first to third intermediate layers sequentially stacked on the surface of the substrate, and a surface layer stacked on the surface of the third intermediate layer.
(First Intermediate Layer)
The first intermediate layer was formed by depositing silicon by a vacuum deposition method using electron beams at a degree of vacuum of $5\times10^{-4}$ Pa under conditions in which an average thickness of 291 nm was to be achieved.
(Second Intermediate Layer)
The second intermediate layer was formed by depositing diamond-like carbon by an RF plasma CVD method at 13.56 MHz using methane gas as a raw material under conditions in which an average thickness of 137 nm was to be achieved.
(Third Intermediate Layer)
The third intermediate layer was formed by depositing silicon by a vacuum deposition method using electron beams under conditions in which an average thickness of 874 nm was to be achieved.
(Surface Layer)
The surface layer was formed by depositing diamond-like carbon by an RF plasma CVD method at 13.56 MHz using methane gas as a raw material under conditions in which an average thickness of 1109 nm was to be achieved.

Production Example 42

An optical component in Production Example 42 was experimentally produced under the same conditions as in Production Example 41, except that the degree of vacuum during the stacking of the first intermediate layer and the third intermediate layer was set to $2\times10^{-4}$ Pa.

Production Example 43

An optical component in Production Example 43 was experimentally produced under the same conditions as in Production Example 41, except that the degree of vacuum during the stacking of the first intermediate layer and the third intermediate layer was set to $1\times10^{-4}$ Pa.

Production Example 44

An optical component in Production Example 44 was experimentally produced under the same conditions as in Production Example 41, except that the degree of vacuum during the stacking of the first intermediate layer and the third intermediate layer was set to $1\times10^{-3}$ Pa.

Production Example 45

An optical component in Production Example 45 includes the same substrate as in Production Example 41, a first intermediate layer stacked on the surface of the substrate, and a surface layer stacked on the surface of the first intermediate layer.
(First Intermediate Layer)
The first intermediate layer was formed by depositing silicon by a vacuum deposition method using electron beams at a degree of vacuum of $5\times10^{-4}$ Pa under conditions in which an average thickness of 279 nm was to be achieved.
(Surface Layer)
The surface layer was formed by depositing diamond-like carbon by an RF plasma CVD method at 13.56 MHz using methane gas as a raw material under conditions in which an average thickness of 1345 nm was to be achieved.

Production Example 46

An optical component in Production Example 46 was experimentally produced under the same conditions as in Production Example 45, except that the degree of vacuum during the stacking of the first intermediate layer was set to $2\times10^{-4}$ Pa.

Production Example 47

An optical component in Production Example 47 was experimentally produced under the same conditions as in Production Example 45, except that the degree of vacuum during the stacking of the first intermediate layer was set to $1\times10^{-4}$ Pa.

Production Example 48

An optical component in Production Example 48 was experimentally produced under the same conditions as in Production Example 45, except that the degree of vacuum during the stacking of the first intermediate layer was set to $1\times10^{-3}$ Pa.
<Evaluation>
For the optical components in Production Examples 1 to 48, the oxygen content of the first intermediate layer was measured, and a constant temperature and humidity test and a weathering test were performed. The optical components were evaluated on the basis of the measurements of the infrared transmittance in an initial state (immediately after experimental production), the infrared transmittance after the constant temperature and humidity test, and the infrared transmittance after the weathering test, the visual evaluation of a surface appearance after the constant temperature and humidity test, and the visual evaluation of a surface appearance after the weathering test.
(Oxygen Content)
The oxygen content of the first intermediate layer was measured by removing a surface layer region having a depth of 50 nm from a surface of the layer by sputtering and performing measurement by electron spectroscopy for chemical analysis (ESCA) in conformity with JIS-K0146 (2002). The sputtering was performed under conditions in which an average removal rate of 32.47 nm/min was to be achieved when the material for the layer was $SiO_2$. The measurement conditions of the electron spectroscopy for chemical analysis were as follows: X-ray wavelength 100 μm, output 25 W, acceleration voltage 15 kV, transmission energy 55,112 eV, X-ray incident angle 90°, and photoelectron take-off angle 45°.

(Constant Temperature and Humidity Test)

The constant temperature and humidity test was performed by holding the optical component at a temperature of 85° C. and a relative humidity of 95% for 240 hours in conformity with JIS-C60068-2-3 (1987).

(Weathering Test)

The weathering test was performed at a temperature of 63±3° C. and a humidity of 50±5% through irradiation using a sunshine carbon arc lamp (255 W/m$^2$) for 1000 hours in conformity with JIS-D0205 (1987).

(Infrared Transmittance)

The infrared transmittance was measured as an average transmittance of infrared light having a wavelength of 8 μm or more and 12 μm or less by a method conforming to JIS-B7107 (1997).

(Visual Evaluation of Appearance)

The appearance was visually evaluated as follows. When no particular change was visually observed compared with the initial state, an evaluation outcome of "A" was given. When spot-like detachment of the surface layer was visually observed, an evaluation outcome of "B" was given. When the detachment was relatively serious, an evaluation outcome of "C" was given.

Tables 3 and 4 collectively show the evaluation results.

TABLE 3

| | Oxygen content of first intermediate layer [atomic %] | Infrared transmittance in initial state [%] | Infrared transmittance after constant temperature and humidity test [%] | Infrared transmittance after weathering test [%] | Evaluation of appearance after constant temperature and humidity test | Evaluation of appearance after weathering test |
|---|---|---|---|---|---|---|
| Production Example 1 | 10 | 73.9 | 73.4 | 73.2 | A | B |
| Production Example 2 | 5 | 74.6 | 74.6 | 74.6 | A | B |
| Production Example 3 | 3 | 75.1 | 75.1 | 75.1 | A | B |
| Production Example 4 | 16 | 72.3 | 70.8 | 70.3 | B | C |
| Production Example 5 | 10 | 72.6 | 72.2 | 72.1 | A | B |
| Production Example 6 | 5 | 73.7 | 73.7 | 73.7 | A | B |
| Production Example 7 | 3 | 74.2 | 74.2 | 74.2 | A | B |
| Production Example 8 | 16 | 71.0 | 69.8 | 69.4 | B | C |
| Production Example 9 | 10 | 71.5 | 71.2 | 71.1 | A | B |
| Production Example 10 | 5 | 72.9 | 72.9 | 72.9 | A | B |
| Production Example 11 | 3 | 73.3 | 73.3 | 73.3 | A | B |
| Production Example 12 | 16 | 70.8 | 70.1 | 69.9 | B | C |
| Production Example 13 | 10 | 72.7 | 72.4 | 72.3 | A | B |
| Production Example 14 | 5 | 73.2 | 73.2 | 73.2 | A | B |
| Production Example 15 | 3 | 74.0 | 74.0 | 74.0 | A | B |
| Production Example 16 | 16 | 70.2 | 68.8 | 67.1 | B | C |
| Production Example 17 | 10 | 73.2 | 72.6 | 72.2 | B | C |
| Production Example 18 | 5 | 74.1 | 74.1 | 73.8 | B | C |
| Production Example 19 | 3 | 74.6 | 74.6 | 74.3 | B | C |
| Production Example 20 | 16 | 72.1 | 70.3 | 69.9 | C | C |
| Production Example 21 | 10 | 72.1 | 71.7 | 71.6 | A | B |
| Production Example 22 | 5 | 72.7 | 72.7 | 72.7 | A | B |
| Production Example 23 | 3 | 73.1 | 73.1 | 73.1 | A | B |
| Production Example 24 | 16 | 71.7 | 70.4 | 69.9 | B | C |

TABLE 4

| | Oxygen content of first intermediate layer [atomic %] | Infrared transmittance in initial state [%] | Infrared transmittance after constant temperature and humidity test [%] | Infrared transmittance after weathering test [%] | Evaluation of appearance after constant temperature and humidity test | Evaluation of appearance after weathering test |
|---|---|---|---|---|---|---|
| Production Example 25 | 10 | 74.0 | 73.5 | 73.4 | A | B |
| Production Example 26 | 5 | 74.4 | 74.4 | 74.3 | A | B |
| Production Example 27 | 3 | 74.7 | 74.7 | 74.7 | A | B |
| Production Example 28 | 16 | 72.7 | 71.5 | 71.2 | B | C |
| Production Example 29 | 10 | 74.1 | 73.8 | 73.8 | A | B |
| Production Example 30 | 5 | 74.6 | 74.5 | 74.6 | A | B |
| Production Example 31 | 3 | 74.8 | 74.8 | 74.8 | A | B |
| Production Example 32 | 16 | 73.0 | 71.0 | 70.9 | B | C |
| Production Example 33 | 10 | 72.9 | 72.3 | 72.2 | A | B |
| Production Example 34 | 5 | 73.1 | 73.1 | 73.1 | A | B |
| Production Example 35 | 3 | 73.3 | 73.3 | 73.3 | A | B |
| Production Example 36 | 16 | 72.1 | 70.8 | 70.6 | B | C |
| Production Example 37 | 10 | 74.2 | 73.7 | 73.6 | A | B |
| Production Example 38 | 5 | 74.7 | 74.5 | 74.5 | A | B |
| Production Example 39 | 3 | 75.1 | 75.0 | 75.0 | A | B |
| Production Example 40 | 16 | 73.0 | 70.6 | 69.8 | B | C |
| Production Example 41 | 10 | 73.6 | 73.1 | 73.0 | A | B |
| Production Example 42 | 5 | 74.0 | 73.9 | 73.8 | A | B |
| Production Example 43 | 3 | 74.5 | 74.3 | 74.2 | A | B |

TABLE 4-continued

|  | Oxygen content of first intermediate layer [atomic %] | Infrared transmittance in initial state [%] | Infrared transmittance after constant temperature and humidity test [%] | Infrared transmittance after weathering test [%] | Evaluation of appearance after constant temperature and humidity test | Evaluation of appearance after weathering test |
| --- | --- | --- | --- | --- | --- | --- |
| Production Example 44 | 16 | 72.2 | 70.3 | 69.3 | B | C |
| Production Example 45 | 10 | 73.0 | 72.7 | 72.5 | A | B |
| Production Example 46 | 5 | 73.3 | 73.1 | 72.8 | A | B |
| Production Example 47 | 3 | 73.5 | 73.5 | 73.4 | A | B |
| Production Example 48 | 16 | 71.6 | 70.0 | 69.4 | B | C |

As is clear from Tables, the weather resistance can be improved by setting the oxygen content of the intermediate layer containing silicon as a main component to 10 atomic % or less.

REFERENCE SIGNS LIST 1 substrate
2 intermediate layer
3 surface layer

The invention claimed is:

1. An optical component comprising:
a translucent substrate;
one or more intermediate layers stacked on at least one of an incident surface and an exit surface of the substrate; and
a surface layer stacked on an outermost layer of the one or more intermediate layers, the surface layer containing diamond-like carbon as a main component,
wherein at least one intermediate layer among the one or more intermediate layers contains silicon as a main component, and
the intermediate layer containing silicon as a main component has an oxygen content of 1 atomic % or more and 10 atomic % or less and the average thickness of the intermediate layer is 5 μm or less.

2. The optical component according to claim 1, comprising a plurality of the intermediate layers, wherein at least one intermediate layer among the plurality of intermediate layers contains diamond-like carbon as a main component.

3. The optical component according to claim 1, wherein the substrate contains a sintered body of zinc sulfide as a main component.

* * * * *